United States Patent
Nam et al.

(10) Patent No.: US 7,592,268 B2
(45) Date of Patent: Sep. 22, 2009

(54) METHOD FOR FABRICATING SEMICONDUCTOR DEVICE

(75) Inventors: Ki-Won Nam, Kyoungki-do (KR); Kyung-Won Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 153 days.

(21) Appl. No.: 11/295,902

(22) Filed: Dec. 6, 2005

(65) Prior Publication Data

US 2006/0276018 A1 Dec. 7, 2006

(30) Foreign Application Priority Data

Jun. 7, 2005 (KR) .................. 10-2005-0048474

(51) Int. Cl.
*H01L 21/00* (2006.01)

(52) U.S. Cl. .................. 438/763; 438/778; 438/785; 438/791; 257/E21.293; 257/E21.267; 257/E21.639; 257/E21.661; 257/E29.042

(58) Field of Classification Search ................ 438/257, 438/259, 267, 270, 230, 256, 254, 275, 302–304, 438/283–284, 641, 710–711, 720, 935, 680, 438/595, 683, 763, 778, 785, 791; 257/314–316, 257/E23.099, E21.17, E21.267, 293, 639, 257/661, E29.042
See application file for complete search history.

(56) References Cited

U.S. PATENT DOCUMENTS

| 6,528,430 B2 * | 3/2003 | Kwan et al. ............... 438/763 |
| 6,664,156 B1 | 12/2003 | Ang et al. |
| 6,884,464 B2 * | 4/2005 | Luo et al. ............. 427/255.29 |
| 7,220,635 B2 * | 5/2007 | Brask et al. ............... 438/216 |
| 7,265,039 B2 * | 9/2007 | Oh et al. ................... 438/527 |
| 7,396,777 B2 * | 7/2008 | Jung et al. ................. 438/778 |
| 2002/0142616 A1 * | 10/2002 | Giewont et al. ............ 438/745 |
| 2002/0177309 A1 * | 11/2002 | Chen ......................... 438/689 |
| 2004/0086640 A1 * | 5/2004 | Luo et al. ............... 427/248.1 |
| 2004/0126983 A1 * | 7/2004 | Kim ........................... 438/396 |
| 2005/0087828 A1 | 4/2005 | Kim et al. |
| 2005/0136583 A1 * | 6/2005 | Chen et al. ................ 438/199 |
| 2005/0159017 A1 * | 7/2005 | Kim et al. .................. 438/791 |
| 2006/0128150 A1 * | 6/2006 | Gandikota et al. ......... 438/681 |

(Continued)

FOREIGN PATENT DOCUMENTS

CN 1217581 A 5/1999

(Continued)

OTHER PUBLICATIONS

Chinese Patent Application for Invention 200510135168.4 in the name of Hynix Semiconductor Inc. First Office Action issued by Chinese Patent Office on Sep. 14, 2007.

*Primary Examiner*—Michael S Lebentritt
(74) *Attorney, Agent, or Firm*—Blakely, Sokoloff, Taylor & Zafman LLP

(57) ABSTRACT

A method for fabricating a semiconductor device is provided. The method includes: forming a plurality of gate lines on a substrate by performing an etching process; forming an oxide layer on the gate lines and the substrate by employing an atomic layer deposition (ALD) method; and sequentially forming a buffer oxide layer and a nitride layer on the oxide layer.

14 Claims, 2 Drawing Sheets

U.S. PATENT DOCUMENTS

| | | | |
|---|---|---|---|
| 2006/0267081 A1* | 11/2006 | Kim | 257/327 |
| 2007/0032008 A1* | 2/2007 | Kim et al. | 438/199 |
| 2007/0122988 A1* | 5/2007 | Luo et al. | 438/303 |
| 2007/0298568 A1* | 12/2007 | Mokhlesi | 438/257 |
| 2008/0057610 A1* | 3/2008 | Lee et al. | 438/52 |
| 2008/0111198 A1* | 5/2008 | Jang et al. | 257/392 |
| 2008/0116503 A1* | 5/2008 | Tsurumi et al. | 257/316 |
| 2008/0286589 A1* | 11/2008 | Shero et al. | 428/472 |
| 2009/0159955 A1* | 6/2009 | Lee et al. | 257/321 |

FOREIGN PATENT DOCUMENTS

| | | |
|---|---|---|
| CN | 1292431 A | 4/2001 |
| CN | 1612325 A | 5/2005 |
| JP | 2004-104098 A | 4/2004 |
| KR | 10-2004-0086691 A | 10/2004 |

\* cited by examiner

METHOD FOR FABRICATING SEMICONDUCTOR DEVICE

FIELD OF THE INVENTION

The present invention relates to a method for fabricating a semiconductor device; and, more particularly, to a method for fabricating a semiconductor device capable of preventing a self-aligned contact (SAC) fail of a landing plug contact.

DESCRIPTION OF RELATED ARTS

One of the biggest limitations that occurs during a process for fabricating a landing plug contact (LPC) module under 80 nm level is that gate spacers are not reduced in thickness accordingly as the device is shrinking, resulting in a great burden to an LPC opening and gap filling process.

Currently, a cell spacer nitride layer required in an 80 nm level device is mostly formed in a uniform thickness ranging from approximately 280 Å to approximately 300 Å. Therefore, a spacing distance between gates is continuously decreasing, practically. The decreasing spacing distance may: result in an increased aspect ratio inside a contact hole; cause a void due to a reduction in gap-fill margin while forming an inter-layer dielectric (ILD); and cause a contact not to be opened while an LPC oxide layer is etched by a self-aligned contact (SAC) process.

On the other hand, as the large scale of integration in semiconductor devices is accelerating, various elements composing the semiconductor devices are generally formed in a stacked structure, and thus a notion of a contact plug (or a pad) is introduced.

For forming such contact plug, an LPC technology is introduced and commonly used. The LPC technology introduces an opening that has an upper region larger than a bottom region, to provide a larger contact region with a minimal portion of the bottom region, and a larger process margin for a follow-up process on the upper region.

Furthermore, it is difficult to etch between structures with a high aspect ratio during such contact formation. Herein, an SAC process is introduced, wherein the SAC process acquires an etch profile by utilizing an etch selectivity ratio between two different materials, i.e., oxide and nitride.

CF and CHF based gases are used in the SAC process. Herein, an etch stop layer and spacers, which are formed by employing nitride layers, are needed to prevent a damage on bottom conductive patterns.

During the SAC process, to minimize the thickness of an etch target, the etch stop layer, the spacers and the inter-layer insulation layer are removed up to the upper region of a gate hard mask nitride layer through a planarizing process, i.e., chemical mechanical polishing (CMP) process, after forming the inter-layer insulation layer.

On the other hand, during an etching process for forming the spacers and SAC holes in the SAC process, an SAC fail may occur due to a short circuit between a gate conductive layer and a plug, wherein the short circuit is commonly caused by an etching loss in the gate hard mask nitride layer of a gate line.

Especially, when a recess gate is employed in a dynamic random access memory (DRAM) to improve a refresh characteristic, a silicide layer may have different levels of stress due to a height difference between an active region and a field region. Thus, excessive oxidation on a lateral wall of a silicide layer often occurs, causing the SAC fail.

FIGS. 1A to 1B are cross-sectional views illustrating a conventional method for fabricating a semiconductor device.

As shown in FIG. 1A, device isolation regions 12 are formed in a substrate 11 by utilizing a shallow trench isolation (STI) process. Furthermore, a gate oxide layer, although not illustrated, is formed over the substrate 11, and then a plurality of gate lines are formed on the gate oxide layer. Herein, etch of the gate lines includes a polysilicon layer 13, a silicide layer 14, a hard mask nitride layer 15, and an anti-reflective coating layer 16, formed in a sequential order. At this time, the anti-reflective coating layer 16 is formed for an easy photo-exposure process when patterning the hard mask nitride layer 15 by the photo-exposure process and a subsequent developing process after coating photoresist, although not illustrated, on the hard mask nitride layer 15. Herein, the anti-reflective coating layer 16 is made of silicon oxynitride (SiON).

Subsequently, a light oxidation process is performed after forming the gate lines. Through the light oxidation process, an oxide layer 17 is formed on etched and exposed regions of the polysilicon layer 13 and the silicide layer 14.

On the other hand, an excessive growth 'A' of the oxide layer 17 is generated on a lateral wall of the gate line due to abnormal oxidation of the silicide layer 14 during the light oxidation process.

As shown in FIG. 1B, an ion implantation process is performed on the above resulting substrate structure. Next, a buffer oxide layer 18 is formed to prevent a stress from nitride. Then, a nitride layer 19 is formed on the buffer oxide layer 18. Herein, the buffer oxide layer 18 is formed in a furnace.

Although follow-up processes are not illustrated herein, if an inter-layer oxide layer is formed over the above substrate structure including the gate lines, and an LPC process is performed, then the following results may occur. According to an etching process in FIG. 1B, the inter-layer oxide layer is removed, and the nitride layer 19, which is an SAC barrier layer, is opened while etching an LPC, resulting in a loss of a certain depth of the nitride layer 19 due to the etching process. At this time, the excessive growth 'A' portion of the nitride layer 19 receives an excessive damage by the above etching process, and is completely opened to cause a loss in the buffer oxide layer 18, and thus causes an SAC fail in the polysilicon layer 13.

As described above, due to the silicide stress difference, the abnormal oxidation (excessive growth) may occur after the light oxidation process, and subsequently the gate lines may be exposed during the LPC etching, resulting in the SAC fail.

SUMMARY OF THE INVENTION

It is, therefore, an object of the present invention to provide a method for fabricating a semiconductor device capable of preventing a self-aligned contact (SAC) fail of a landing plug contact (LPC).

In accordance with an aspect of the present invention, there is provided a method for fabricating a semiconductor device, including: forming a plurality of gate lines on a substrate by performing an etching process; forming an oxide layer on the gate lines and the substrate by employing an atomic layer deposition (ALD) method; and sequentially forming a buffer oxide layer and a nitride layer on the oxide layer.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

A method for fabricating a semiconductor device in accordance with specific embodiments of the present invention will be described in detail with reference to the accompanying drawings.

Figure 1A:
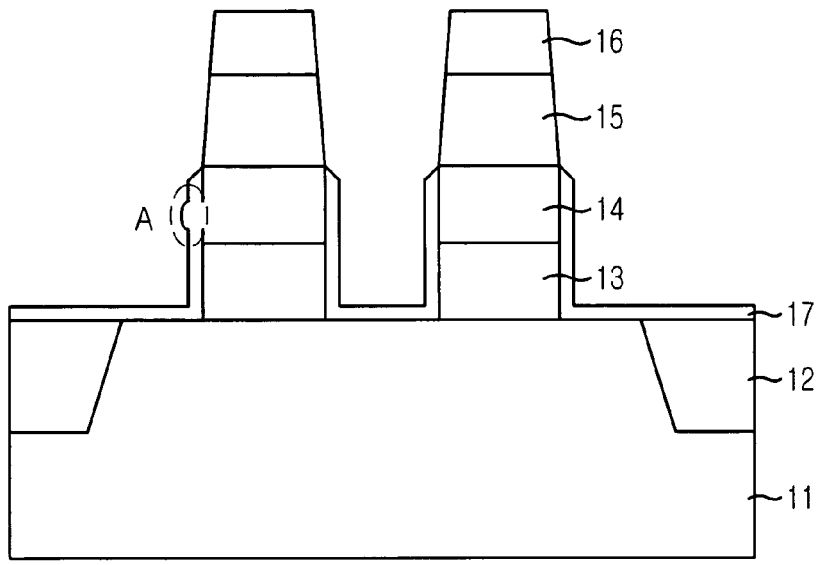
FIGS. 1A and 1B are cross-sectional views illustrating a conventional method for fabricating a semiconductor device.
Figure 1B:
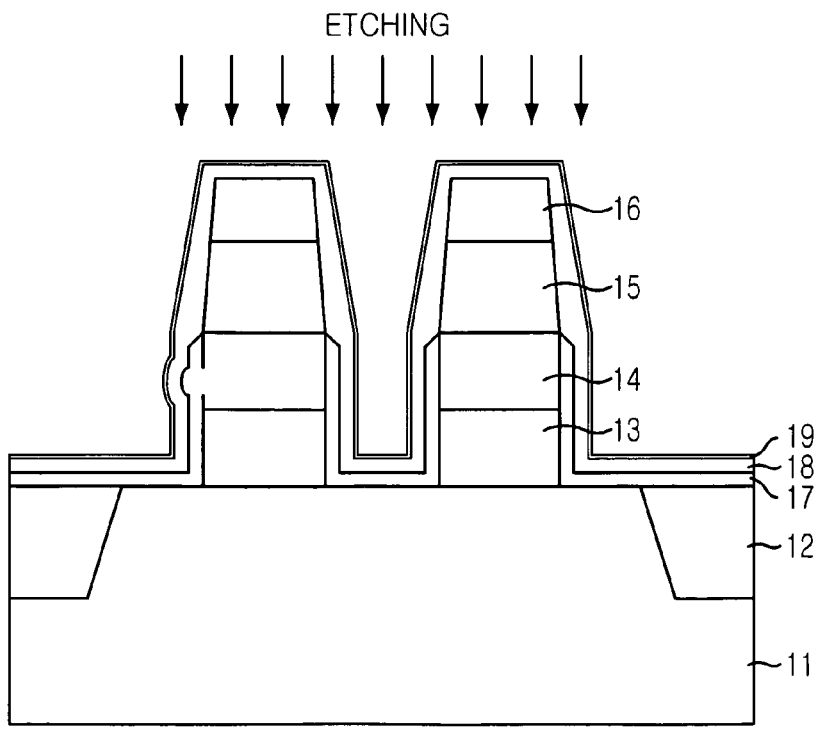
Figure 2:
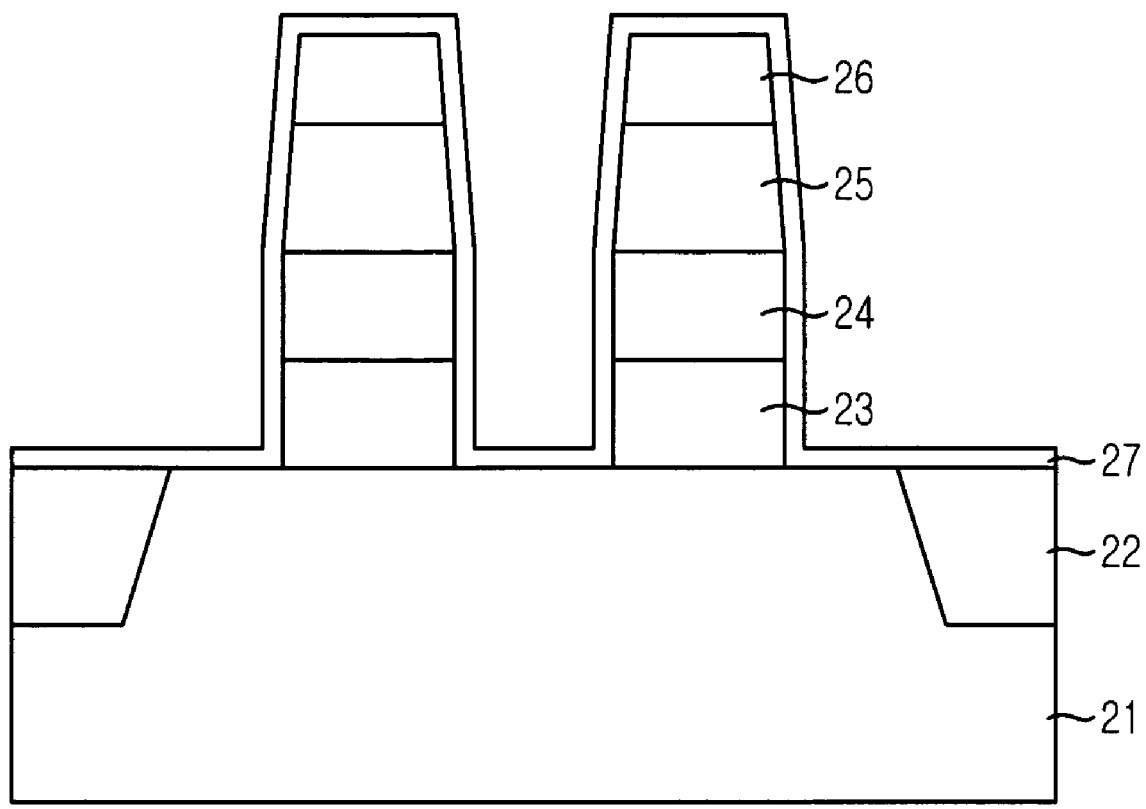
FIG. 2 is a cross-sectional view illustrating a method for fabricating a semiconductor device in accordance with a specific embodiment of the present invention.

FIG. 2 is a cross-sectional view illustrating a method for fabricating a semiconductor device in accordance with a specific embodiment of the present invention.

As shown in FIG. 2, device isolation regions 22 are formed in a substrate 21 by employing a shallow trench isolation (STI) process. Then, a gate oxide layer (not shown), a polysilicon layer 23, a silicide layer 24, and a hard mask nitride layer 25 are formed on the substrate 21 in sequential order.

Subsequently, a photoresist layer is formed on the hard mask nitride layer 25, and a photoresist pattern, although not illustrated, is formed by patterning the photoresist layer with photo-exposure and developing processes. Then, the hard mask nitride layer 25 is etched using the photoresist pattern as an etch mask. Herein, as illustrated in FIG. 2, an anti-reflective coating (ARC) layer 26 made of silicon oxynitride (SiON) may be formed on the hard mask nitride layer 25 for an easy photo-exposure process of the photoresist pattern.

Furthermore, a strip process for the photoresist pattern and a cleaning process for removing after-etching residues of the hard mask nitride layer 25 are performed.

Moreover, the silicide layer 24, the polysilicon layer 23, and the gate oxide layer are etched, using the hard mask nitride layer 25 as an etch barrier.

Then, after gate lines are formed, an oxide layer 27 is formed on the gate lines and the substrate 21. Herein, an oxidation process is performed in a manner to inhibit a reaction between oxygen gas and a silicon (Si) seed inside the silicide layer 24 to the minimum, and to grow only the necessary oxide layer 27 on the substrate 21.

In more detail, by repeatedly performing an oxide layer formation process by employing an atomic layer deposition (ALD) method using oxygen gas as a source gas on the above resulting substrate structure, the oxide layer 27 is formed in a uniform thickness ranging from approximately 100 Å to approximately 200 Å not only on top of the substrate 21, but on the horizontal and vertical surfaces of the gate lines.

To form the oxide layer 27, the ALD method is performed at a temperature ranging from approximately 80° C. to approximately 200° C., and an abnormal oxidation is prevented by inhibiting the reaction between the oxygen gas and the silicon seed inside the silicide layer 24. Herein, the oxide layer 27 is formed by repeatedly performing a cycle until a desired thickness is achieved. The cycle includes: implanting HCD as a source gas at a quantity of flow of approximately 100 sccm for approximately 1 minute to approximately 2 minutes; pumping HCD as a purge gas for approximately 3 minutes; implanting $H_2O$ as a reaction gas at a quantity of flow of approximately 600 sccm for approximately 2 minutes; and pumping $H_2O$ as a purge gas for approximately 4 minutes.

On the other hand, there may exist some impurities in the oxide layer 27 formed by employing the ALD method, and thus, an additional follow-up process using ozone plasma may be performed to improve device reliability. Herein, the time period of the ozone plasma treatment process may vary according to the total thickness of the oxide layer 27, and it is preferable to lengthen the time period as the thickness of the oxide layer 27 is increased.

Subsequently, a buffer oxide layer and a nitride layer are formed over the above resulting substrate structure, although not illustrated. Furthermore, an inter-layer insulation layer is formed over the above resulting substrate structure including the gate lines, and then an LPC etching is performed. Hence, the nitride layer works as an etch barrier, and a self-aligned contact (SAC) may be formed without any gate line losses.

In accordance with the specific embodiment of the present invention, the above described oxidation process supports the object of the conventional light oxidation process, and at the same time, inhibits the reaction of the silicon seed existing inside the silicide layer to prevent oxidation of the silicide caused by the stress. As a result, excessive oxidation on a lateral wall of the silicide layer does not occur, and an SAC fail is prevented during an LPC mask and etching process.

The present application contains subject matter related to the Korean patent application No. KR 2005-0048474, filed in the Korean Patent Office on Jun. 7, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a plurality of gate lines on a substrate by performing an etching process;
   forming an oxide layer on the gate lines and the substrate by repeatedly employing an atomic layer deposition (ALD) method to avoid excessive oxidation; and
   sequentially forming a buffer oxide layer and a nitride layer on the oxide layer,
   wherein the forming of the oxide layer on the gate lines and the substrate further includes a follow-up process using ozone plasma to remove impurities inside the oxide layer,
   wherein the oxide layer is formed in a uniform thickness on a top of the substrate and vertical and horizontal surfaces of the gate lines.

2. The method of claim 1, wherein the ALD method grows the oxide layer by repeatedly performing a cycle which includes:
   implanting HCD as a source gas;
   pumping HCD as a purge gas;
   implanting $H_2O$ as a reaction gas; and
   pumping $H_2O$ as a purge gas.

3. The method of claim 2, wherein the implanting of HCD as the source gas is performed at a quantity of flow of approximately 100 sccm for approximately 1 minute to approximately 2 minutes.

4. The method of claim 2, wherein the pumping of HCD as the purge gas is performed for approximately 3 minutes.

5. The method of claim 2, wherein the implanting of $H_2O$ as the reaction gas is performed at a quantity of flow of approximately 600 sccm for approximately 2 minutes.

6. The method of claim 2, wherein the pumping of $H_2O$ as the purge gas is performed for approximately 4 minutes.

7. The method of claim 1, wherein the ALD method is performed at a temperature ranging from approximately 80° C. to approximately 200° C.

8. The method of claim 4, wherein the ozone plasma is implemented for a different range of processing time according to the thickness of the oxide layer.

9. The method of claim 1, wherein the gate lines are formed of a stacked structure including a polysilicon layer, a silicide layer, and a hard mask nitride layer.

10. The method of claim 1, wherein the oxide layer is formed in a thickness ranging from approximately 100 Å to approximately 200 Å.

11. A method for fabricating a semiconductor device, comprising:

forming a plurality of gate lines on a substrate by performing an etching process;

forming an oxide layer on the gate lines and the substrate by repeatedly employing an atomic layer deposition (ALD) method to avoid excessive oxidation; and sequentially forming a buffer oxide layer and a nitride layer on the oxide layer, wherein the oxide layer is formed in a uniform thickness on a top of the substrate and vertical and horizontal surfaces of the gate lines.

12. The method of claim 11, wherein the oxide layer is formed in a thickness ranging from approximately 100 Å to approximately 200 Å.

13. The method of claim 12, wherein the forming of the oxide layer on the gate lines and the substrate further includes a follow-up process using ozone plasma to remove impurities inside the oxide layer.

14. The method of claim 13, wherein the ozone plasma is implemented for a different processing time based on the thickness of the oxide layer.

* * * * *